US012685072B2

(12) United States Patent
Tsai

(10) Patent No.: US 12,685,072 B2
(45) Date of Patent: Jul. 14, 2026

(54) WORKING STATION SYSTEMS FOR DISPENSING A FLUID IN CONNECTION WITH ELECTRONICS ASSEMBLY

(71) Applicant: Kulicke and Soffa Hi-Tech Co., Ltd., New Taipei City (TW)

(72) Inventor: Jolly Tsai, New Tapei City (TW)

(73) Assignee: Kulicke and Soffa Hi-Tech Co., Ltd., New Taipei City (TW)

( * ) Notice: Subject to any disclaimer, the term of this patent is extended or adjusted under 35 U.S.C. 154(b) by 91 days.

(21) Appl. No.: 18/953,423

(22) Filed: Nov. 20, 2024

(65) Prior Publication Data

US 2025/0174474 A1      May 29, 2025

Related U.S. Application Data

(60) Provisional application No. 63/602,407, filed on Nov. 23, 2023.

(51) Int. Cl.
H10P 72/00 (2026.01)
B65G 21/22 (2006.01)

(52) U.S. Cl.
CPC .......... H10P 72/0604 (2026.01); B65G 21/22 (2013.01); H10P 72/0402 (2026.01); H10P 72/0456 (2026.01)

(58) Field of Classification Search
CPC . B65G 21/22; H10P 72/0402; H10P 72/0456; H10P 72/0604
See application file for complete search history.

(56) References Cited

U.S. PATENT DOCUMENTS

| | | | |
|---|---|---|---|
| 5,323,528 A | 6/1994 | Baker | |
| 5,639,301 A * | 6/1997 | Sasada | H10P 72/0456 |
| | | | 118/66 |
| 6,412,622 B1 | 7/2002 | Jung et al. | |
| 2003/0110623 A1* | 6/2003 | Haji | H10P 72/0604 |
| | | | 29/832 |
| 2020/0006099 A1* | 1/2020 | Yamauchi | H10P 72/0446 |
| 2022/0135400 A1 | 5/2022 | Manens | |

FOREIGN PATENT DOCUMENTS

| | | | |
|---|---|---|---|
| CN | 101641008 A | | 2/2010 |
| JP | 10202440 A | | 8/1998 |
| JP | 2004241742 A | * | 8/2004 |
| JP | 2011064792 A | | 3/2011 |

OTHER PUBLICATIONS

Machine Translation of JP-2004241742-A.*
International Search Research for International PCT application No. PCT/CN2024/133753 mailed on Feb. 13, 2025.

* cited by examiner

*Primary Examiner* — Jeremy Carroll
(74) *Attorney, Agent, or Firm* — Christopher M. Spletzer, Sr.

(57) ABSTRACT

Disclosed is a working station system, including at least one working station and at least one plug-in station alternatively arranged and partially overlapped with each other. At least one component included in the plug-in station, and/or a moving range thereof, is partially located in the working station without interfering with components included in the working station, thereby reducing a total width of the working station system. Exemplary working stations include dispensing equipment for dispensing a fluid in connection with electronics assembly, and exemplary plug-in stations include AOI equipment.

27 Claims, 5 Drawing Sheets

WORKING STATION SYSTEMS FOR DISPENSING A FLUID IN CONNECTION WITH ELECTRONICS ASSEMBLY

CROSS-REFERENCE TO RELATED APPLICATION

This application claims the benefit of U.S. Provisional Application No. 63/602,407, filed Nov. 23, 2023, the content of which is incorporated herein by reference.

FIELD

The invention relates generally to working station systems for dispensing a fluid in connection with electronics assembly, and more particularly to working station systems including a working station and a plug-in station partially overlapped with each other such that a total occupied area of the system can be reduced.

BACKGROUND

In the manufacturing fields of, for example, semiconductors, electronic devices, and other precision devices, different equipment for a manufacturing process, such as dispensing equipment and Automated Optical Inspection (AOI) equipment, are often used in cooperation to ensure product quality and manufacturing efficiency.

In conventional cooperation systems, such as a working station system including dispensing equipment and AOI equipment, the cooperation can be carried out to include the following procedures.

First, it is needed to design the printed circuit board (PCB) of the product and establish the manufacturing processes for dispensing, in which software of the dispensing equipment is used to program the dispensing equipment to determine the precise locations, speed, volume, and other relevant parameters for dispensing. These parameters typically depend on the product requirements.

Second, the dispensing equipment is used to accurately apply adhesive or solder onto specified locations on the PCB, such as a connecting element, a soldering point, or other areas. The dispensing positions and dispensing amount can be adjusted by program code of the dispensing equipment according to needs.

Once the dispensing is complete, the PCB is transferred, for example, by a conveyor, to the AOI equipment, at which the PCB is inspected for problems such as solder defects, component misalignment, or shorts by the AOI equipment using optical technologies, such as cameras and image processing equipment. A program of the AOI equipment will analyze the inspection results and generate inspection reports.

Finally, if the AOI equipment detects any problems, it can communicate with the dispensing equipment or the manufacturing system for relevant adjustments. This feedback mechanism may include stopping the production line, recalibrating the parameters of the dispensing machine, or marking the PCBs with problems for further inspection or repair.

The cooperation between the dispensing equipment and the AOI equipment aims to achieve a manufacturing production with high quality and efficiency. Through precise dispensing and real-time optical inspection of the equipment, problems that occurred during the manufacturing process are detected early and addressed promptly, thereby reducing the defective rate of the products and improving quality and reliability of the products.

A conventional cooperation system (e.g., a working station system including dispensing equipment and AOI equipment) is illustrated in FIG. 1. As a standard working station, each working station D may be a dispensing equipment or an AOI equipment. Workpieces T are processed by the dispensing equipment followed by the AOI equipment for confirming the dispensing quality, while being transmitted on a conveyor C.

Each working station D may be provided with a set of guide rails oriented in three dimensions, such as a first guide rail X, a second guide rail Y, and a third guide rail Z, which are respectively oriented in three different directions perpendicular to one another.

For example, two first guide rails X are disposed at two sides of the conveyer C and parallel to the transmission direction of the workpieces T, respectively; the second guide rail Y is disposed on or over the first guide rails X through supports P or other suspension mechanism; the third guide rail Z is disposed on the second guide rail Y; and a tool (not shown) can be disposed to move along the three guide rails X, Y, Z for processing such as dispensing or optical inspection, which can be referred to as a gantry assembly.

In the conventional working station system using a gantry assembly, each processing is carried out at an upper portion of the system (for example, above the conveyer C), each working station D has a station width W1 of 900 mm for processing and transmission, in which, however, only a working width W2 of 300 to 400 mm (e.g., 320 mm) is needed for dispensing or optical inspection or other processing, while the rest non-working widths W3 at both sides have a considerable proportion relative to the station width W1 but no processing is carried out in these regions.

SUMMARY

In view of the foregoing disadvantages of the conventional working station system, an objective of the invention is to provide an improved working station system including at least one working station and at least one plug-in station, which are partially overlapped with each other, such that the total occupied area of the working station system can be reduced.

For achieving the foregoing objectives, the invention provides a working station system for electronics assembly including at least one working station and at least one plug-in station alternatively arranged and partially overlapped with each other, wherein at least one of (i) at least one component included in the plug-in station, and (ii) a moving range thereof, is partially located in the working station without interfering with components included in the working station, thereby reducing a total width of the working station system.

According to other embodiments of the invention, the working station systems recited in the preceding paragraphs may have any one or more of the following features: the at least one working station (D) includes dispensing equipment; the at least one plug-in station (I) includes AOI equipment; the working station system includes a plurality of working stations (D), each of the plurality of working stations (D) including dispensing equipment; the at least one working station includes a working area and a non-working area, and the at least one component of the plug-in station, and/or the moving range thereof, partially located in the working station is partially located in the non-working area of the working station; the at least one component of the plug-in station partially located in the working station is disposed at a level under the components of the working station; the at least one component included in each working station includes: a fixed stage for loading a workpiece, three primary guide rails oriented in different directions and disposed above the fixed stage, wherein one of the primary guide rails is parallel to a transmission direction of the workpiece, and a primary tool disposed to move along the primary guide rails for processing the workpiece; the primary tool is a dispensing needle for dispensing a fluid onto the workpiece; a relative movement between the primary tool and the workpiece is achieved by a movement of the primary tool along the primary guide rails $(X_1, Y_1, Z_1)$; the at least one component included in each plug-in station includes: a movable stage for loading and transmitting the workpiece, three secondary guide rails oriented in different directions, wherein one of the secondary guide rails parallel to the transmission direction of the workpiece is disposed at a level under the fixed stage and the movable stage is disposed thereon, and the rest of the secondary guide rails are disposed above the movable stage, and a secondary tool disposed to move along the rest of the secondary guide rails for processing the workpiece; The secondary tool includes a camera; a relative movement between the secondary tool and the workpiece is achieved jointly by a movement of the movable stage along the one of the secondary guide rails as well as a movement of the secondary tool along the rest of the secondary guide rails; the at least one component included in each working station further includes another fixed stage for loading another workpiece, another three primary guide rails oriented in different directions and disposed above the another fixed stage, wherein one of the another primary guide rails is parallel to a transmission direction of the another workpiece, and another primary tool disposed to move along the another three primary guide rails for processing the another workpiece, wherein the transmission direction of the workpiece is parallel to the transmission direction of the another workpiece; the at least one component included in each plug-in station includes a movable stage for loading and transmitting the workpiece and the another workpiece, three secondary guide rails oriented in different directions, wherein two of the secondary guide rails are disposed at a level under the fixed stage and the another fixed stage in which one of the two of the secondary guide rails is parallel to the transmission direction of the workpiece and the transmission direction of the another workpiece, and the movable stage is disposed thereon, and a rest of the secondary guide rails is disposed above the movable stage, and a secondary tool disposed to move along the rest of the secondary guide rails for processing the workpiece and the another workpiece; the plug-in station receives (i) the workpiece from the fixed stage or (ii) the another workpiece from the another fixed stage of a previous working station, and supplies the processed workpiece or the processed another workpiece to the fixed stage or the another fixed stage of a next working station after processing of the plug-in station; the at least one component included in each plug-in station includes: a movable stage for loading and transmitting the workpiece, three secondary guide rails oriented in different directions, wherein one of the secondary guide rails parallel to the transmission direction of the workpiece is disposed at a level under the fixed stage and the movable stage is disposed thereon, another movable stage for loading and transmitting the another workpiece, another secondary guide rail parallel to the transmission direction of the another workpiece and disposed at a level under the another fixed stage and the another movable stage is disposed thereon, and a secondary tool, the rest of the secondary guide rails are disposed above the movable stage and the another movable stage, and the secondary tool is disposed to move along the rest of the secondary guide rails for processing the workpiece and the another workpiece; the movable stage of the plug-in station receives the workpiece from the fixed stage of a previous working station, and supplies the processed workpiece to the fixed stage of a next working station after processing of the plug-in station, and the another movable stage of the plug-in station receives the another workpiece from the another fixed stage of a previous working station, and supplies the processed another workpiece to the another fixed stage of a next working station after processing of the plug-in station; the at least one component included in each plug-in station includes a movable stage for loading and transmitting the workpiece, three secondary guide rails oriented in different directions, wherein one of the secondary guide rails parallel to the transmission direction of the workpiece is disposed at a level under the fixed stage and the movable stage is disposed thereon, and a rest of the secondary guide rails are disposed above the movable stage, a secondary tool disposed to move along the rest of the secondary guide rails for processing the workpiece, another movable stage for loading and transmitting the another workpiece, another three secondary guide rails oriented in different directions, wherein one of the another secondary guide rails parallel to the transmission direction of the another workpiece is disposed at a level under the another fixed stage and the another movable stage is disposed thereon, and a rest of the another secondary guide rails are disposed above the another movable stage, and another secondary tool disposed to move along the rest of the another secondary guide rails for processing the another workpiece; the movable stage of the plug-in station receives the workpiece from the fixed stage of a previous working station, and supplies the processed workpiece to the fixed stage of a next working station after processing of the plug-in station, and the another movable stage of the plug-in station receives the another workpiece from the another fixed stage of the previous working station, and supplies the processed another workpiece to the another fixed stage of the next working station after processing of the plug-in station; the one of the secondary guide rails disposed at the level under the fixed stage, and/or a moving range of the movable stage thereon, is partially located in the working station without interfering with the components of the working station; the working station has a station width of 800 to 1000 mm, the working area has a working width of 300 to 400 mm, and the non-working area has a non-working width of 200 to 300 mm; a plug-in station is interposed between two adjacent working stations, and the component included in the plug-in station and/or the moving range thereof is inserted into each of the two adjacent working stations by 200 to 300 mm, respectively, so as to have a reduced interposed station width (W4) of 100 to 200 mm; a plug-in station is disposed at an end of the working station system, and the component included in the plug-in station and/or the moving range thereof is inserted into an adjacent working station by 200 to 300 mm, so as to have a reduced station width of 300 to 500 mm; the movable stage is disposed at a level same as the fixed stage; during transferring the workpiece between the working station and the plug-in station, the primary or secondary tool is replaced by a picking tool to transfer the workpiece; and/or further comprising a mechanical arm for transferring the workpiece between the working station and the plug-in station.

In certain embodiments of the invention, by maintaining the position of the gantry assembly (primary guide rails) of the working station at the upper portion of the working station system, while changing the position of the main moving element (secondary guide rail oriented in the transmission direction) to be the lower portion of the working station system to overlap with the original rail transit space under the gantry assembly (primary guide rails), the upper primary guide rails can be partially overlapped with the lower secondary guide rail(s), thereby work and transmission can be carried out at the same time, and the total width of the working station system can be reduced.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity.

DETAILED DESCRIPTION

Figure 1:
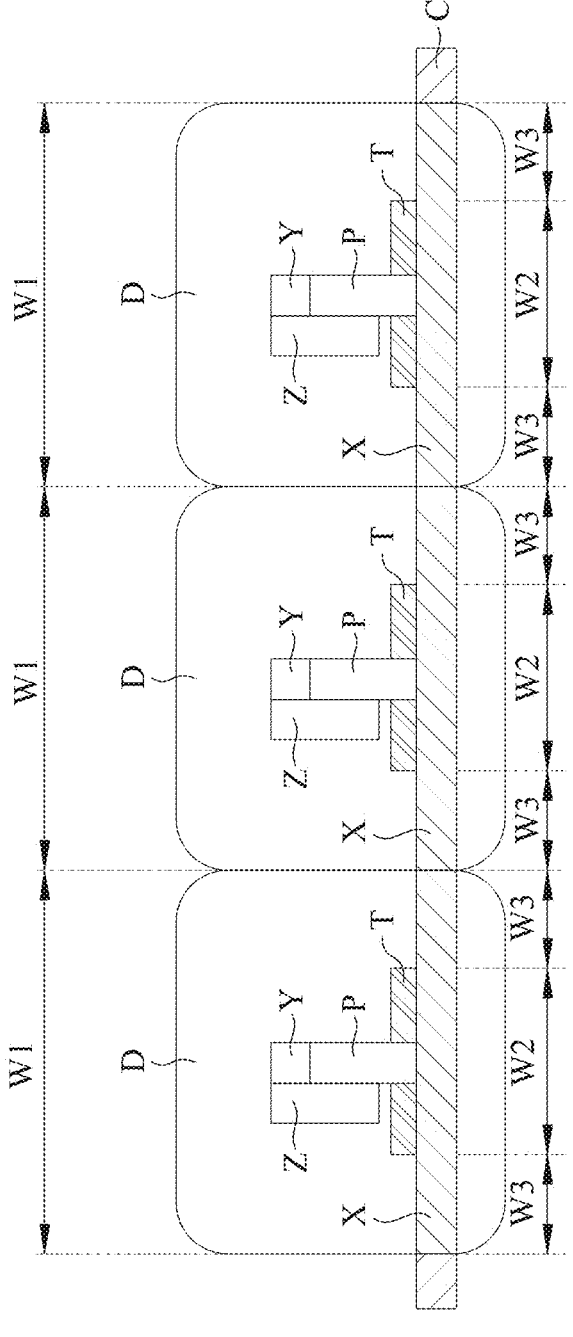
FIG. 1 is a side view of a conventional working station system in which working stations are not overlapped with each other.

The accompanying drawings are included to provide a further understanding of the invention, and are incorporated in and constitute a part of this specification. The drawings illustrate embodiments of the invention and, together with the description, serve to explain the principles of the invention.

In the specification, all of the technical features of any one embodiment can be applied to another embodiment, as long as there is no conflict.

In the specification, the terms "first," "second," "third," and the like are only used for distinguishing one and another features, these features are not confined by these terms. Therefore, a first element described herein may be a second element in a technical concept of the invention.

According to various embodiments of the invention, a "working station" may be any of: a fluid dispensing station, a pick and place station, a die attach station, a clip attach station, a curing station, an inspection station (e.g., AOI), or any other station configured to perform a step of an electronic assembly process (e.g., attaching a semiconductor die to a lead frame). Additionally, a "working station" may include any one or more of: fluid dispensing equipment, AOI equipment, laminating equipment, welding equipment, sucking equipment, pick and place equipment, cleaning equipment, or any other equipment configured to perform a step of an electronic assembly process.

According to various embodiments of the invention, a "plug-in station" may be any auxiliary station related to an electronic assembly process. Such auxiliary stations may perform process steps that augment the production process (e.g., production accuracy/quality, production speed, etc.).

Such auxiliary stations may perform inspection of a workpiece (and/or inspection of dispensed fluid on a workpiece), UV curing operations for curing a dispensed fluid from dispensing equipment, calibration of tools, cleaning of tools, additional processing to relieve production bottlenecks (e.g., additional adhesive dispensing), material handling, etc. Such plug-in stations may be physically smaller than a working station (e.g., a smaller width). Exemplary plug-in stations include: a fluid dispensing station, a UV curing station for curing a dispensed fluid from dispensing equipment, a pick and place station, a die attach station, a clip attach station, a curing station, an inspection station (e.g., AOI), or any other station configured to perform a step of an electronic assembly process (e.g., attaching a semiconductor die to a lead frame). Additionally, a "plug-in station" may include any one or more of: fluid dispensing equipment, UV curing equipment for curing a dispensed fluid from dispensing equipment, AOI equipment, laminating equipment, welding equipment, sucking equipment, pick and place equipment, cleaning equipment, or any other equipment configured to perform a step of an electronic assembly process.

According to various embodiments of the invention, "fluid dispensing equipment" may include a station for dispensing any of glue, adhesives, solder paste, solder flux, epoxy, underfill, resin, etc., for use in electronics assembly. Such fluid dispensing stations/equipment may include a fluid dispensing needle, a fluid storage tank, a motion system for moving the fluid dispensing needle, etc.

According to various embodiments of the invention, "AOI equipment" may include a station for inspecting a workpiece (or any part of a workpiece). For example, AOI equipment may be configured to inspect the results of curing operations (e.g., UV curing operations) of UV curing equipment, parameters of a dispensed fluid dispensed by dispensing equipment, etc. For example, the inspection may relate to a fluid dispensed by fluid dispensing equipment. Specific examples of inspecting the fluid may include inspecting the shape, volume, area, viscosity, curing (e.g., UV curing) or other characteristics related to the fluid. The inspection equipment included in the AOI equipment may include, for example, a camera (e.g., an imaging camera, an optical camera, an infrared camera, etc.).

First Embodiment

Figure 2:
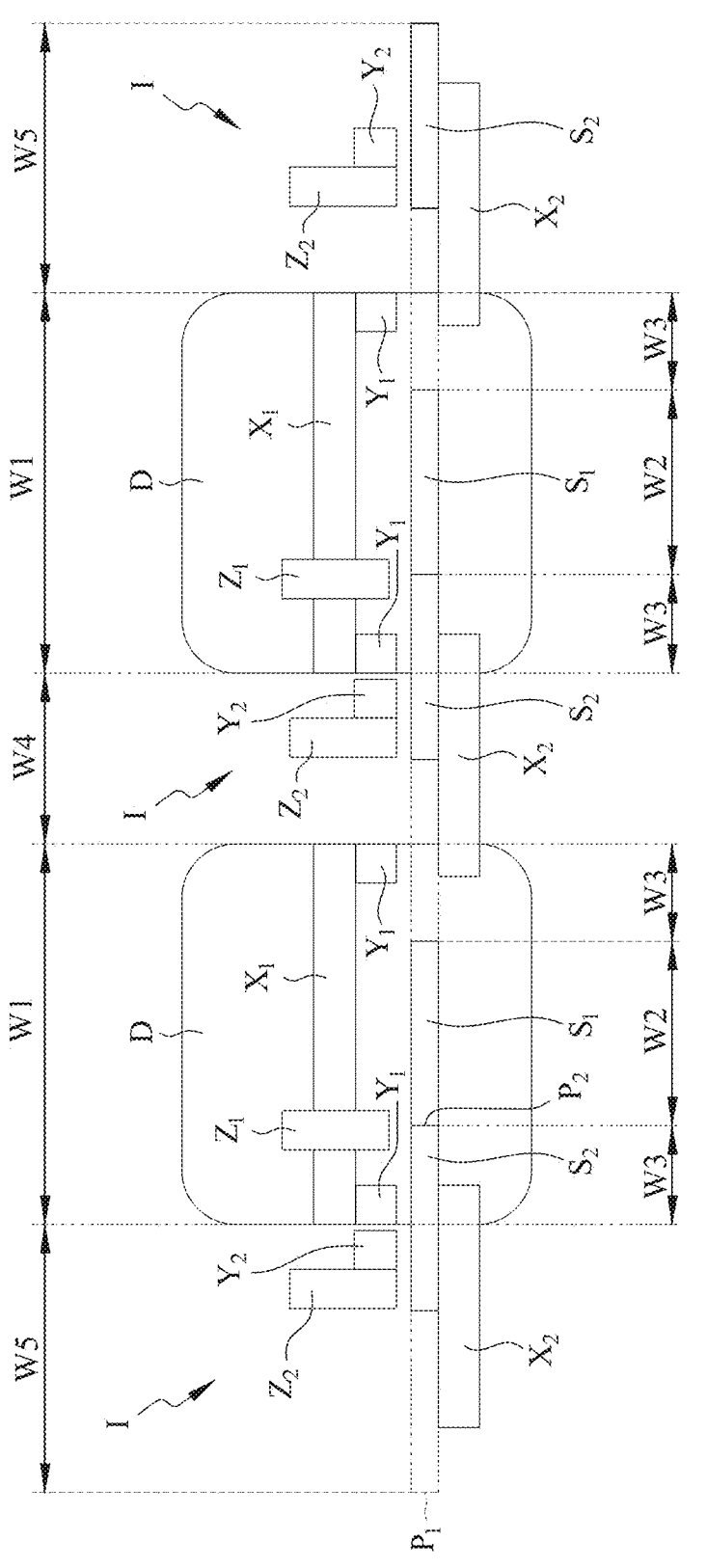
FIG. 2 is a side view of a working station system with overlapped stations according to an exemplary embodiment of the invention.

In order to achieve the forgoing objectives, referring to FIG. 2, a first embodiment of the invention is illustrated, providing a working station system including at least one working station D (e.g., a fluid dispensing station, a die attach station, etc.) and at least one plug-in station I (e.g., another fluid dispensing station, an inspection/AOI station, etc.) alternatively arranged and partially overlapped with each other, wherein the working station D may be a standard working station.

In the embodiment, at least one of the components included in the plug-in station I, and/or a moving range thereof, is partially located in the working station D without interfering with components included in the working station D, thereby reducing a total width of the working station system. The component may be a tool of the plug-in station, a moving stage of the plug-in station, or a motion system of a tool or a moving state of the plug-in station. For example, where plug-in station I is an inspection/AOI station, the component/tool may be an optical device (e.g., a camera, a mirror, a lens, etc.). Where plug-in station I includes fluid dispensing equipment, the component may be, for example, a fluid dispensing needle. In a further example, where working station D includes die attach equipment, the component may be, for example, a suction tool, a pick and place tool, etc.

Specifically, the working station D includes a working area and a non-working area (e.g., an area beyond where the functional work of the working station is accomplished), and the at least one of the components of the plug-in station I, and/or the moving range thereof (e.g., part of a motion system carrying a component of plug-in station I) partially located in the working station D, is partially located in the non-working area of the working station D.

In a preferred embodiment, the at least one of the components of the plug-in station I partially located in the working station D is disposed at a level under the components of the working station D. For example, a portion of a motion system of a component of plug-in station I (e.g., an x-axis motion system of a camera of an AOI station, an x-axis motion system of a moving stage, etc.) may be disposed under a component of a working station D (e.g., a fixed stage that supports a workpiece during a dispensing operation). Exemplary components of a working station D include a stage for supporting a workpiece (e.g., a fixed stage, a moving stage), a motion system, a tool (e.g., a fluid dispensing needle, a pick and place tool, etc.), etc.

In the embodiment, the working station system may include one or more working station(s) D and/or one or more plug-in station(s) I, the number of these stations and the type of end or interposed stations are not limited to the disclosed aspect. For example, although two working stations D and three plug-in stations I are illustrated, embodiments of working station system can include: one working station D and one plug-in station I; one working station D and two plug-in stations I; two working stations D and one plug-in station I; two working stations D and two plug-in stations I; three working stations D and two plug-in stations I; three working stations D and three plug-in stations I; etc. It is contemplated that each working station D in the working station system may be the same (e.g., wherein each working station D is a fluid dispensing station), or may include various different stations (e.g., a fluid dispensing station and a die attach station). Similarly, each plug-in station I may be the same (e.g., wherein each plug-in station I is an inspection/AOI station), or may include various different stations (e.g., two inspection/AOI stations and a curing station; a fluid dispensing station, an inspection/AOI station, and a curing station, etc.).

In the embodiment, the components included in each working station D include: a fixed stage $S_1$ for loading a workpiece (not shown); three primary guide rails $X_1, Y_1, Z_1$ oriented in different directions and disposed above the fixed stage $S_1$ through supports or other suspension mechanism; and a primary tool (not shown) disposed to move along the primary guide rails $X_1, Y_1, Z_1$ for processing the workpiece (e.g., a lead frame, a printed circuit board, a semiconductor element, etc.). Exemplary primary tools include a fluid dispensing needle for a fluid dispensing station, a camera for an inspection station, a suction tool for a pick and place station, etc.

The fixed stage $S_1$ is fixedly-disposed in the working station D such that the workpiece is fixedly-loaded on the fixed stage $S_1$ during processing of the working station D.

The primary guide rails $X_1, Y_1, Z_1$ may be perpendicular to one another to facilitate the spatial arrangement, wherein one of the primary guide rails (such as $X_1$) is parallel to the transmission direction of the workpiece (referred to as "transmission direction" hereinafter).

Therefore, in the working station D, the relative movement for processing between the primary tool (e.g., a fluid dispensing needle of a fluid dispensing station) and the workpiece (e.g., a leadframe, a substrate, etc.) is achieved by the movement of the primary tool along the primary guide rails $X_1, Y_1, Z_1$ above the fixed stage $S_1$.

In the embodiment, each of the first, second and third primary guide rails $X_1, Y_1, Z_1$ can be provided in a number of one or more, which is not limited to the disclosed aspect.

The components included in each plug-in station I include: a movable stage $S_2$ for loading and transmitting the workpiece; three secondary guide rails $X_2, Y_2, Z_2$ oriented in different directions; and a secondary tool (not shown). Exemplary secondary tools include a camera for an inspection/AOI station, a fluid dispensing needle for a fluid dispensing station, etc.

The secondary guide rails $X_2, Y_2, Z_2$ may be perpendicular to one another to facilitate the spatial arrangement, wherein one of the secondary guide rails (such as $X_2$) parallel to the transmission direction is disposed at a level under the fixed stage $S_1$, and the movable stage $S_2$ is disposed thereon with a moving range from a position $P_1$ to a position $P_2$, such that the workpiece can be loaded on the movable stage $S_2$ and move as the movement of the movable stage $S_2$, and the rest of the secondary guide rails (such as $Y_2$ and $Z_2$) are disposed above the movable stage $S_2$ through supports or other suspension mechanism.

The secondary tool can be disposed to move along the rest of the secondary guide rails (such as $Y_2$ and $Z_2$) for processing the workpiece.

Therefore, in the plug-in station I, the relative movement between the secondary tool and the workpiece is achieved jointly by the movement of the movable stage $S_2$ along the one of the secondary guide rails (such as $X_2$) under the fixed stage $S_1$ and the movable stage $S_2$ as well as the movement of the secondary tool along the rest of the secondary guide rails (such as $Y_2$ and $Z_2$).

In the embodiment, each of the first, second and third secondary guide rails $X_2, Y_2, Z_2$ can be provided in a number of one or more, which is not limited to the disclosed aspect.

Specifically, since one of the secondary guide rails (such as $X_2$) of the plug-in station D is disposed at a level under the fixed stage $S_1$, the one of the secondary guide rails (such as $X_2$) as well as the moving range of the movable stage $S_2$ thereon can be partially located in the space under the components of the working station D, which is referred to as "gantry", without interfering with the components of the working station D.

Therefore, compared with the system of FIG. 1 in which respective working stations are not overlapped with each other, in the embodiment, work and transmission can be carried out at the same time, and the total width of the working station system can be reduced.

For example, as shown in FIG. 2, the working station D may have a station width W1 of 800 to 1000 mm (e.g., 900 mm), which includes a working width W2 of 300 to 400 mm (e.g., 320 mm) needed for processing and rest two non-working widths W3 at two sides of 200 to 300 mm (e.g., 240 mm). Therefore, the components of the plug-in station I can be partially disposed into the non-working area of the working station D under the components of the working station D. In an embodiment, the components of the plug-in station I can be inserted into the working station D by 240 mm at each side.

That is, for a plug-in station I interposed between two working stations D, the components of the plug-in station I can be inserted into the working station D by 200 to 300 mm (e.g., 240 mm) at each side (that is, totally 400 to 600 mm, e.g., 480 mm, at both sides), respectively, such that the interposed plug-in station I only needs an interposed station width W4 of 160 mm to achieve a complete working stroke. In addition, for an end plug-in station I at the end of the working station system, the components of the plug-in station I only can be inserted into the working station D by 200 to 300 mm (e.g., 240 mm) at one side, such that the end plug-in station I only needs an end station width W5 of 300 to 500 mm (e.g., 400 mm) to achieve a complete working stroke.

In the embodiment, each of the working station D and the plug-in station I can be any processing equipment, such as a dispensing equipment, an AOI equipment, a laminating equipment, a welding equipment, a sucking equipment, and/or a cleaning equipment, amongst others.

In an embodiment, the working station D may be used for processing with a larger loading, and the plug-in station I may be used for processing with a less loading, but it is not limited thereto.

For example, the working station D may be a dispensing equipment, and the plug-in station I may be an AOI equipment.

In an embodiment, the movable stage $S_2$ can be disposed at a level (e.g., the same level as the fixed stage $S_1$) so as to facilitate the transfer of the workpieces between the fixed stage $S_1$ and the movable stage $S_2$.

In the embodiment, the manner for transferring the workpieces between the fixed stage $S_1$ in the working station D and the movable stage $S_2$ in the plug-in station I may further include providing mechanical arms and/or replacing the primary or secondary tool with a picking tool during transferring the workpiece, but it is not limited thereto.

In the embodiment, in order to facilitate the transferring for the workpieces between stages, adjacent stages can be aligned with one another.

The first embodiment described above illustrates the most common aspect of the invention. However, in order to reduce the time required for transferring the workpieces in/out, or to balance the throughput of the working station D and the plug-in station I, any of the working station(s) D or the plug-in station(s) I can be implemented to have parallel multiple production lines, such as double production lines. Therefore, several variations of the embodiments of the invention will be described below.

As used herein, the term "a production line" means a combination of stage(s), guide rails, and tool(s) which can individually complete one single processing of the workpiece.

Second Embodiment

Figures 3A, 3B:
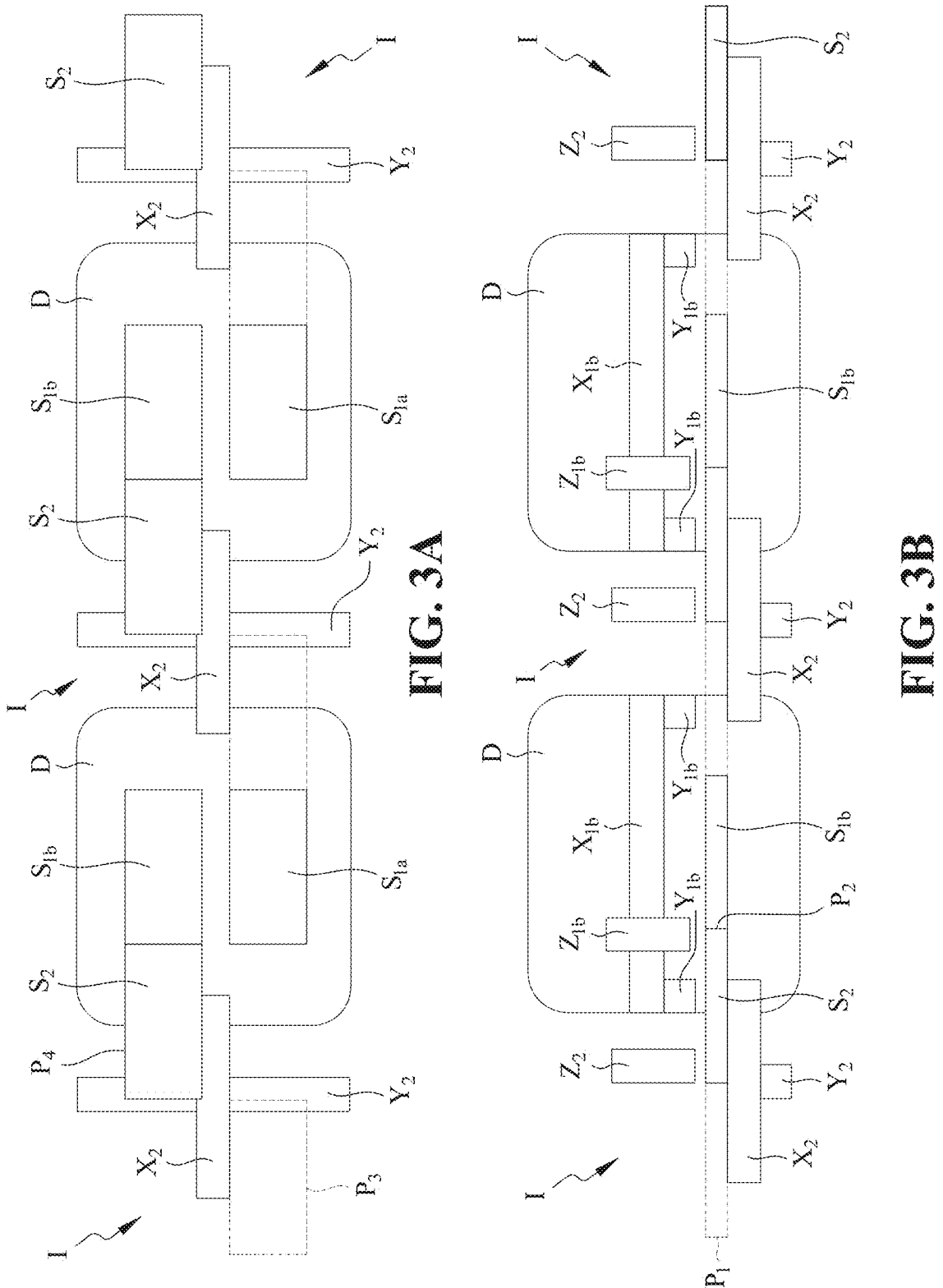
FIGS. 3A and 3B are top and side views of a working station system with overlapped stations according to another exemplary embodiment of the invention.

Referring to FIGS. 3A and 3B, a working station system according to a second embodiment of the invention is illustrated. Such an embodiment is applicable for an application when a single production line of the working station D has a throughput lower than that of a single production line of the plug-in station I.

The second embodiment is similar to the first embodiment in certain aspects. For example, plug-in station I may be partially overlapped with working station D.

The second embodiment is different from the first embodiment in certain aspects. For example, each working station D includes at least two parallel production lines arranged along the transmission direction.

One production line of the working station D includes: a fixed stage $S_{1a}$ for loading a workpiece (not shown); three primary guide rails (not shown) oriented in different directions and disposed above the fixed stage $S_{1a}$; and a primary tool (not shown) disposed to move along the primary guide rails for processing the workpiece.

Another production line of the working station D includes: another fixed stage $S_{1b}$ for loading another workpiece (not shown); three another primary guide rails $X_{1b}$, $Y_{1b}$, $Z_{1b}$ oriented in different directions and disposed above the another fixed stage $S_{1b}$; and another primary tool (not shown) disposed to move along the another primary guide rails $X_{1b}$, $Y_{1b}$, $Z_{1b}$ for processing the another workpiece. In this embodiment, one of the primary guide rails (not shown) is parallel to the transmission direction of the workpiece, one of the another primary guide rails (such as $X_{1b}$) is parallel to a transmission direction of the another workpiece, and the transmission direction of the workpiece is parallel to the transmission direction of the another workpiece.

In order to more clearly illustrate the configuration of the stages, certain elements are omitted in FIG. 3A; for example, the guide rails (such as $X_{1b}$, $Y_{1b}$, $Z_{1b}$, $Z_2$) disposed above the movable stage and the fixed stage are omitted.

In addition, in order to more clearly illustrate the configuration, certain elements are omitted in FIG. 3B; for example, the components of the production line including the fixed stage $S_{1a}$ of the working station D of FIG. 3A are omitted.

The configuration of the components of the production line including the fixed stage $S_{1a}$ are the same (or substantially the same) as that of the components of the production line including the another fixed stage $S_{1b}$ in the working station D.

All configurations and functions of the fixed stage $S_{1a}$ and the another fixed stage $S_{1b}$, the primary guide rails (not shown) and the another primary guide rails $X_{1b}$, $Y_{1b}$, $Z_{1b}$, and the primary tool and the another primary tool in the second embodiment are the same (or substantially the same) as those of the fixed stage $S_1$, the primary guide rails $X_1$, $Y_1$, $Z_1$, and the primary tool in the first embodiment, respectively.

In the second embodiment, in order to facilitate alignment during processing, the positions and level of the fixed stage $S_{1a}$, the primary guide rails (not shown), and the primary tool can correspond to those of the another fixed stage $S_{1b}$, the another primary guide rails $X_{1b}$, $Y_{1b}$, $Z_{1b}$, and the another primary tool, respectively.

In the second embodiment of the invention, the components in each plug-in station I include: a movable stage $S_2$ for loading and transmitting the workpiece and the another workpiece; three secondary guide rails $X_2$, $Y_2$, $Z_2$ oriented in different directions; and a secondary tool (not shown).

In this embodiment, two of the secondary guide rails (such as $X_2$ and $Y_2$) are disposed at a level under the fixed stage $S_{1a}$ and the another fixed stage $S_{1b}$ in which one of the two of the secondary guide rails ($X_2$) is parallel to the transmission direction of the workpiece and the transmission direction of the another workpiece, and the movable stage $S_2$ is disposed thereon, such that the workpiece or the another workpiece can be loaded on the movable stage $S_2$ and move as the movement of the movable stage $S_2$, and a rest of the secondary guide rails (such as $Z_2$) is disposed above the movable stage $S_2$ through supports or other suspension mechanism.

The secondary tool can be disposed to move along the rest of the secondary guide rails (such as $Z_2$) for processing the workpiece and the another workpiece.

Therefore, in the plug-in station I, the relative movement between the secondary tool and the workpiece is achieved jointly by the movement of the movable stage $S_2$ along two of the secondary guide rails (such as $X_2$ and $Y_2$) under the fixed stage $S_{1a}$, the another fixed stage $S_{1b}$, and the movable stage $S_2$ as well as the movement of the secondary tool along the rest of the secondary guide rails (such as $Z_2$).

Therefore, the movable stage $S_2$ has a moving range from the position $P_1$ to the position $P_2$ in the transmission direction (such as on $X_2$), and from a position $P_3$ to a position $P_4$ in the direction of one of the two of the secondary guide rails (such as $Y_2$) not parallel to the transmission direction, as shown in FIG. 3A.

Therefore, compared with the first embodiment, in the second embodiment, by disposing at least two production lines in each working station D, the working station D can achieve at least two times of throughput, so as to be balanced against the throughput of the plug-in station I; in addition, by disposing two of the secondary guide rails (such $X_2$ and $Y_2$) under the movable stage $S_2$, the plug-in station I can receive workpieces from any production line (i.e., the workpiece on the fixed stage $S_{1a}$ or the another workpiece on the another fixed stage $S_{1b}$) of a previous working station D, and supply the processed workpiece or the processed another workpiece to any production line (i.e., the fixed stage $S_{1a}$ or the another fixed stage $S_{1b}$) of a next working station D after processing of the plug-in station I; thereby optimizing the manufacturing process.

Third Embodiment

Figures 4A, 4B:
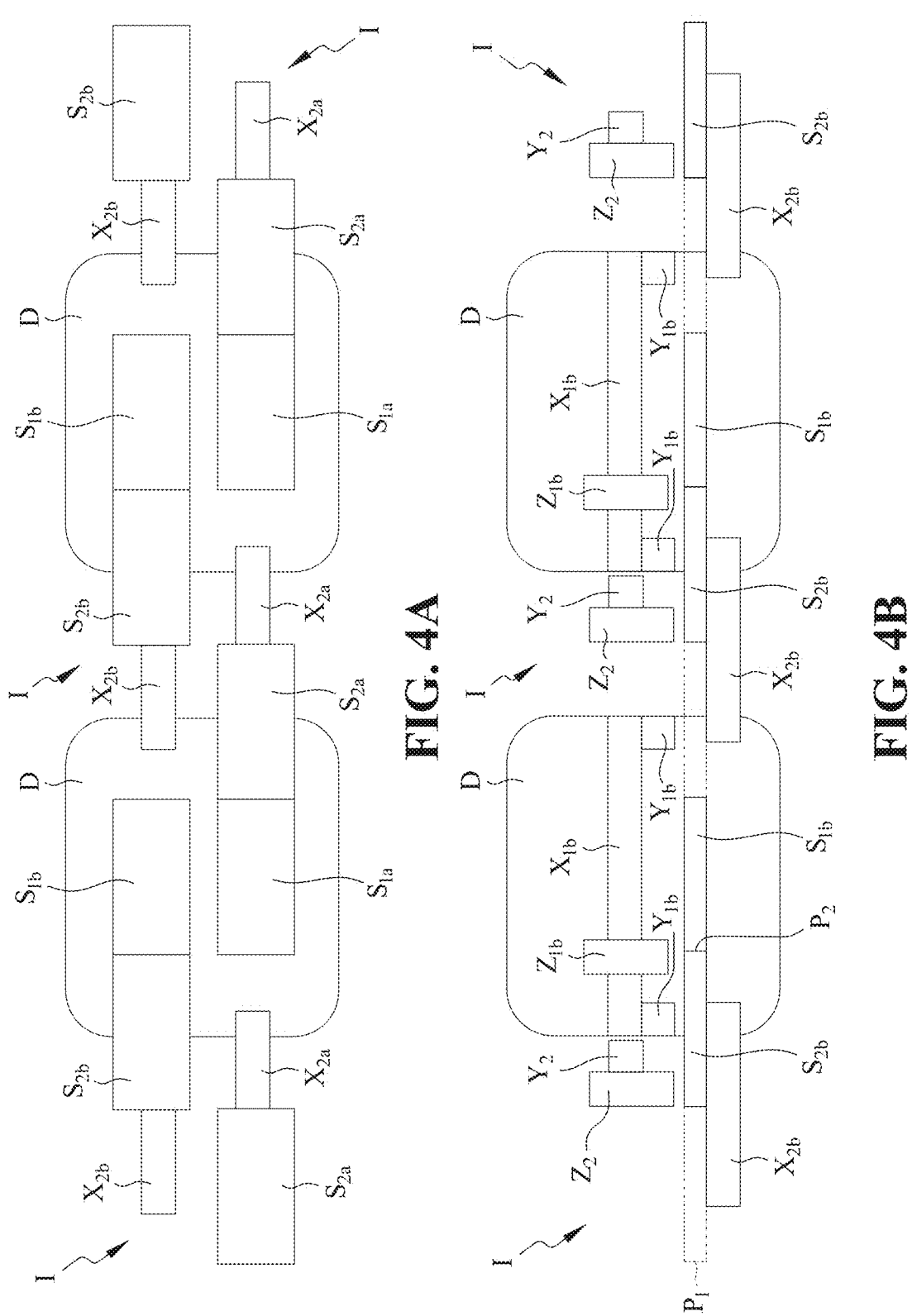
FIGS. 4A and 4B are top and side views of a working station system with overlapped stations according to yet another exemplary embodiment of the invention.

Referring to FIGS. 4A and 4B, a working station system according to a third embodiment of the invention is illustrated. Such an embodiment can be applicable for similar applications as the second embodiment.

The third embodiment is similar to the first and second embodiments in certain aspects. For example, plug-in station I may be partially overlapped with working station D.

The third embodiment is different from the second embodiment in certain aspects. For example, the components included in each plug-in station I of this embodiment include: a movable stage $S_{2a}$ for loading and transmitting the workpiece; three secondary guide rails $X_{2a}$, $Y_2$, $Z_2$ oriented in different directions; another movable stage $S_{2b}$ for loading and transmitting another workpiece; another secondary guide rail $X_{2b}$; and a secondary tool (not shown).

In this embodiment, one of the secondary guide rails (such as $X_{2a}$) parallel to the transmission direction of the workpiece is disposed at a level under the fixed stage $S_{1a}$, and the movable stage $S_{2a}$ is disposed thereon; and the another secondary guide rail $X_{2b}$ is parallel to the transmission direction of the another workpiece and disposed at a level under the another fixed stage $S_{1b}$, and the another movable stage $S_{2b}$ is disposed thereon.

The rest of the secondary guide rails (such $Y_2$ and $Z_2$) are disposed above the movable stage $S_{2a}$ and the another movable stage $S_{2b}$, such that the secondary tool can be disposed to move along the rest of the secondary guide rails (such $Y_2$ and $Z_2$) for processing the workpiece and the another workpiece.

Specifically, the another secondary guide rail $X_{2b}$ is parallel to the transmission direction of the another workpiece and disposed at a level under the another fixed stage $S_{1b}$, and the secondary tool is used to process both the workpiece and the another workpiece.

In order to more clearly illustrate the configuration, certain elements are omitted in FIG. 4A; for example, the guide rails (such as $X_{1b}$, $Y_{1b}$, $Z_{1b}$, $Y_2$, $Z_2$) disposed above the movable stage and the fixed stage are omitted.

In addition, in order to more clearly illustrate the configuration, certain elements are omitted in FIG. 4B; for example, the components of the production line including the fixed stage $S_{1a}$ of the working station D as well as the secondary guide rail $X_{2a}$ and the movable stage $S_{2a}$ of the plug-in station I of FIG. 4A are omitted.

The configuration of the components of the production line including the fixed stage $S_{1a}$ are the same (or substantially the same) as that of the components of the production line including the another fixed stage $S_{1b}$ in the working station D.

The configuration of the secondary guide rail $X_{2a}$ and the movable stage $S_{2a}$ are same as that of the another secondary guide rail $X_{2b}$ and the another movable stage $S_{2b}$ in the plug-in station I.

All configurations and function of components of the working station D in the third embodiment are the same (or substantially the same) as those in the second embodiment.

All configurations and function of the movable stage $S_{2a}$ and the another movable stage $S_{2b}$, the secondary guide rails $X_{2a}$, $Y_2$, $Z_2$ and the another secondary guide rail $X_{2b}$, and the secondary tool and the another secondary tool in the third embodiment are the same (or substantially the same) as those of the movable stage $S_2$, the secondary guide rails $X_2$, $Y_2$, $Z_2$, and the secondary tool in the first embodiment, respectively.

In the third embodiment, in order to facilitate the alignment during processing, the positions and level of the fixed stage $S_{1a}$, the primary guide rails (not shown), the primary tool, the movable stage $S_{2a}$, the secondary guide rail $X_{2a}$, and the secondary tool can correspond to those of the another fixed stage $S_{1b}$, the another primary guide rails $X_{1b}$, $Y_{1b}$, $Z_{1b}$, the another primary tool, the another movable stage $S_{2b}$, the another secondary guide rail $X_{2b}$, and the another secondary tool, respectively.

In the third embodiment, the movable stage $S_{2a}$ of the plug-in station I can receive the workpiece from the fixed stage $S_{1a}$ of a previous working station D, and supply the processed workpiece to the fixed stage $S_{1a}$ of a next working station D after processing of the plug-in station I; in addition, the another movable stage $S_{2b}$ of the plug-in station I can receive the another workpiece from the another fixed stage $S_{1b}$ of the previous working station D, and supplies the processed another workpiece to the another fixed stage $S_{1b}$ of the next working station D after processing of the plug-in station I.

Therefore, compared with the second embodiment, in the third embodiment, by disposing another movable stage $S_{2b}$ and another secondary guide rail $X_{2b}$, the manufacturing process can be further optimized.

Fourth Embodiment

Figures 5A, 5B:
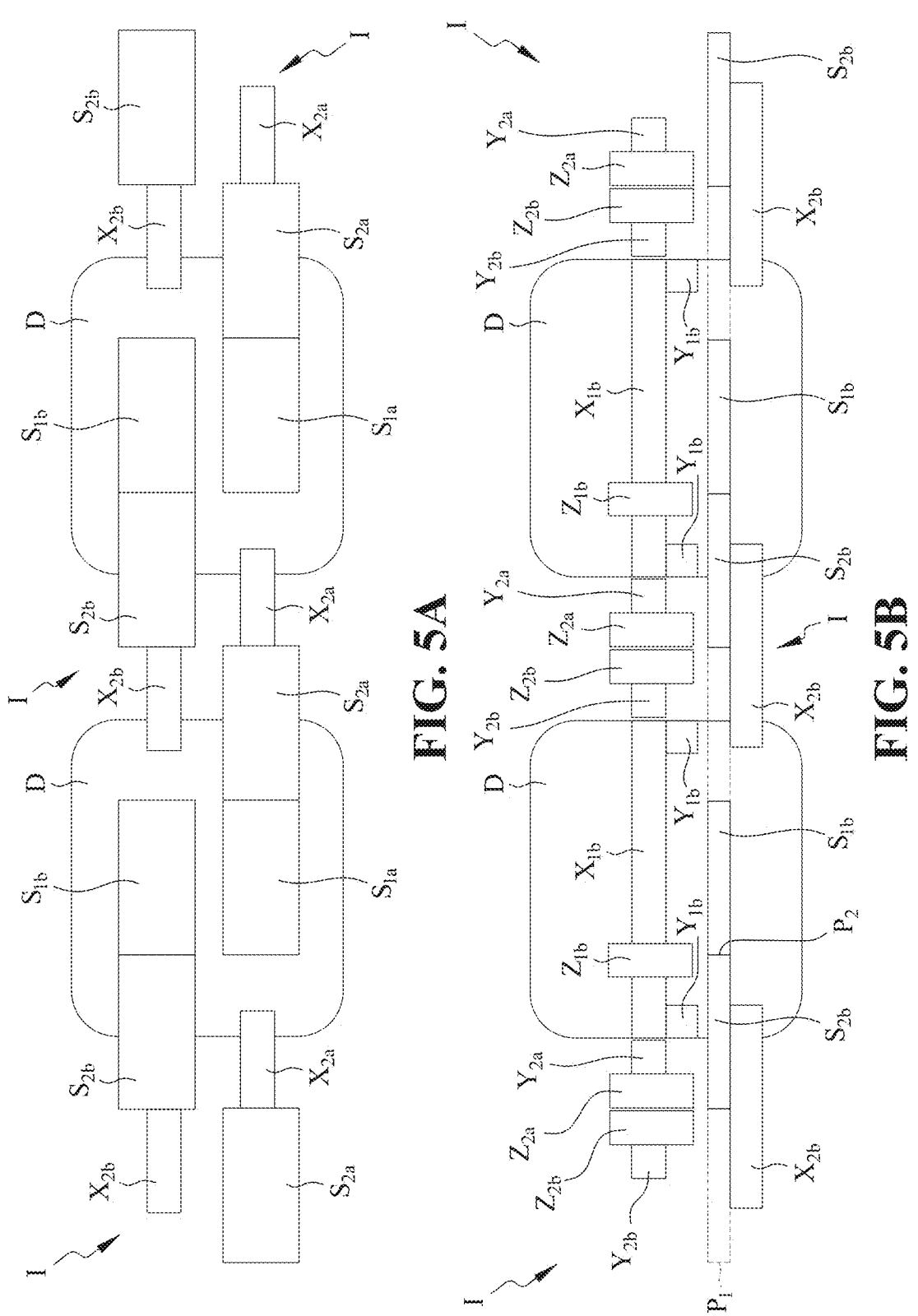
FIGS. 5A and 5B are top and side views of a working station system with overlapped stations according to yet another exemplary embodiment of the invention.

Referring to FIGS. 5A and 5B, a working station system according to a fourth embodiment of the invention is illustrated. Such an embodiment may be applicable for the situation when a single production line of the plug-in station I has a throughput comparable to that of a single production line of the working station D, while the throughput of both are needed to increase.

The fourth embodiment is similar to the first, second, and third embodiments in certain aspects. For example, plug-in station I may be partially overlapped with working station D.

The fourth embodiment is different from the second embodiment in certain aspects. For example, each plug-in station I of this embodiment includes at least two parallel production lines arranged along the transmission direction.

One production line of the plug-in station I includes: a movable stage $S_{2a}$ for loading and transmitting the workpiece; three secondary guide rails $X_{2a}$, $Y_{2a}$, $Z_{2a}$ oriented in different directions; and a secondary tool (not shown).

The secondary guide rails $X_{2a}$, $Y_{2a}$, $Z_{2a}$ may be perpendicular to one another to facilitate the spatial arrangement, wherein one of the secondary guide rails (such as $X_{2a}$) parallel to the transmission direction is disposed at a level under the fixed stage $S_{1a}$, and the movable stage $S_{2a}$ is disposed thereon, such that the workpiece can be loaded on the movable stage $S_{2a}$ and move as the movement of the movable stage $S_{2a}$, and a rest of the secondary guide rails (such as $Y_{2a}$ and $Z_{2a}$) are disposed above the movable stage $S_{2a}$ through supports or other suspension mechanism.

The secondary tool can be disposed to move along the rest of the secondary guide rails (such as $Y_{2a}$ and $Z_{2a}$) for processing the workpiece.

Another production line of the plug-in station I includes: another movable stage $S_{2b}$ for loading and transmitting another workpiece; three another secondary guide rails $X_{2b}$, $Y_{2b}$, $Z_{2b}$ oriented in different directions; and another secondary tool (not shown).

The another secondary guide rails $X_{2b}$, $Y_{2b}$, $Z_{2b}$ may be perpendicular to one another to facilitate the spatial arrangement, wherein one of the another secondary guide rails (such as $X_{2b}$) parallel to the transmission direction is disposed at a level under the another fixed stage $S_{1b}$, and the another movable stage $S_{2b}$ is disposed thereon, such that the another workpiece can be loaded on the another movable stage $S_{2b}$ and move as the movement of the another movable stage $S_{2b}$, and a rest of the another secondary guide rails (such as $Y_{2b}$ and $Z_{2b}$) are disposed above the another movable stage $S_{2b}$ through supports or other suspension mechanism.

The another secondary tool can be disposed to move along the rest of the another secondary guide rails (such as $Y_{2b}$ and $Z_{2b}$) for processing the another workpiece.

Like the third embodiment, in the fourth embodiment, the movable stage $S_{2a}$ of the plug-in station I can receive the workpiece from the fixed stage $S_{1a}$ of a previous working station D, and supply the processed workpiece to the fixed stage $S_{1a}$ of a next working station D after processing of the plug-in station I; in addition, the another movable stage $S_{2b}$ of the plug-in station I can receive the another workpiece from the another fixed stage $S_{1b}$ of the previous working station D, and supplies the processed another workpiece to the another fixed stage $S_{1b}$ of the next working station D after processing of the plug-in station I.

Specifically, all configurations and function of the movable stage $S_{2a}$ and the another movable stage $S_{2b}$, the secondary guide rails $X_{2a}$, $Y_{2a}$, $Z_{2a}$ and the another secondary guide rails $X_{2b}$, $Y_{2b}$, $Z_{2b}$, and the secondary tool and the another secondary tool in the fourth embodiment are the same (or substantially the same) as those of the movable stage $S_2$, the secondary guide rails $X_2$, $Y_2$, $Z_2$, and the secondary tool in the first embodiment, respectively.

In order to more clearly illustrate the configuration, certain elements are omitted in FIG. 5A; for example, the guide rails (such as $X_{1b}$, $Y_{1b}$, $Z_{1b}$, $Y_{2a}$, $Z_{2a}$, $Y_{2b}$, $Z_{2b}$) disposed above the movable stage and the fixed stage are omitted.

In addition, in order to more clearly illustrate the configuration, certain elements are omitted in FIG. 5B; for example, the components of the production line including the fixed stage $S_{1a}$ of the working station D as well as the components of the production line including the movable stage $S_{2a}$ of the plug-in station I of FIG. 5A are omitted.

The configuration of the components of the production line including the fixed stage $S_{1a}$ are the same (or substantially the same) as that of the components of the production line including the another fixed stage $S_{1b}$ in the working station D.

Similarly, the configuration of the components of the production line including the movable stage $S_{2a}$ are the same (or substantially the same) as that of the components of the production line including the another movable stage $S_{2b}$ in the plug-in station I.

In the fourth embodiment, in order to facilitate the alignment during processing, the positions and level of the fixed stage $S_{1a}$, the primary guide rails (not shown), the primary tool, the movable stage $S_{2a}$, the secondary guide rails $X_{2a}$, $Y_{2a}$, $Z_{2a}$, and the secondary tool can correspond to those of the another fixed stage $S_{1b}$, the another primary guide rails $X_{1b}$, $Y_{1b}$, $Z_{1b}$, the another primary tool, the another movable stage $S_{2b}$, the another secondary guide rails $X_{2b}$, $Y_{2b}$, $Z_{2b}$, and the another secondary tool, respectively.

Therefore, compared with the third embodiment, in the fourth embodiment, by disposing at least two production lines in each working station D and by disposing at least two production lines in each plug-in station D, both the working station D and the plug-in station I can achieve at least two times of throughput.

Although the invention has been described with reference certain examples of insertion length of a component of a plug-in station into a working station (e.g., values for W4 and/or W5 in relation to FIG. 2), other ranges are contemplated. In fact, the insertion length may be dictated (and/or maximized) based on the specific application and the availability of space for overlap.

Although the invention has largely been described with reference to specific exemplary working station systems, and stations of such systems (e.g., for dispensing a fluid in connection with electronics assembly, for inspecting the dispensed fluid, etc.), the invention is not limited thereto. For example, aspects of the invention relate to dispensing equipment for dispensing a fluid in connection with applications beyond electronics assembly (e.g., automotive fluid dispensing). Further, aspects of the invention relate to working station systems that have no relationship with fluid dispensing.

Although the invention has been described with reference to the preferred embodiments thereof, it is apparent to those skilled in the art that a variety of modifications and changes may be made without departing from the scope of the invention which is intended to be defined by the appended claims.

What is claimed:

1. A working station system for electronics assembly, comprising:

at least one working station (D), each working station (D) including at least one component, the at least one component included in each working station (D) including (i) a fixed stage (S1) for loading a workpiece, (ii) three primary guide rails (X1, Y1, Z1) oriented in different directions and disposed above the fixed stage (S1), wherein one of the primary guide rails (X1) is parallel to a transmission direction of the workpiece, and (iii) a primary tool disposed to move along the primary guide rails (X1, Y1, Z1) for processing the workpiece; and at least one plug-in station (I), the at least one working station (D) and the at least one plug-in station (I) being alternatively arranged and partially overlapped with each other, wherein at least one of (i) at least one component included in the plug-in station (I), and (ii) a moving range thereof, is partially located in the working station (D) without interfering with components included in the working station (D), thereby reducing a total width of the working station system.

2. The working station system according to claim 1, wherein the at least one working station (D) includes dispensing equipment.

3. The working station system according to claim 2, wherein the at least one plug-in station (I) includes AOI equipment.

4. The working station system according to claim 1, wherein the at least one plug-in station (I) includes AOI equipment.

5. The working station system according to claim 1, wherein the working station system includes a plurality of working stations (D), each of the plurality of working stations (D) including dispensing equipment.

6. The working station system according to claim 1, wherein the at least one working station (D) includes a working area and a non-working area, and the at least one component of the plug-in station (I), and/or the moving range thereof, partially located in the working station (D) is partially located in the non-working area of the working station (D).

7. The working station system according to claim 6, wherein the working station (D) has a station width (W1) of 800 to 1000 mm, the working area has a working width (W2) of 300 to 400 mm, and the non-working area has a non-working width (W3) of 200 to 300 mm.

8. The working station system according to claim 1, wherein the at least one component of the plug-in station (I) partially located in the working station (D) is disposed at a level under the components of the working station (D).

9. The working station system according to claim 1, wherein the primary tool is a dispensing needle for dispensing a fluid onto the workpiece.

10. The working station system according to claim 1, wherein a relative movement between the primary tool and the workpiece is achieved by a movement of the primary tool along the primary guide rails (X1, Y1, Z1).

11. The working station system according to claim 1, wherein the at least one component included in each plug-in station (I) includes a movable stage (S2) for loading and transmitting the workpiece, three secondary guide rails (X2, Y2, Z2) oriented in different directions, wherein one of the secondary guide rails (X2) parallel to the transmission direction of the workpiece is disposed at a level under the fixed stage (S1) and the movable stage (S2) is disposed thereon, and the rest of the secondary guide rails (Y2, Z2) are disposed above the movable stage (S2), and a secondary tool disposed to move along the rest of the secondary guide rails (Y2, Z2) for processing the workpiece.

12. The working station system according to claim 11, wherein the secondary tool includes a camera.

13. The working station system according to claim 11, wherein a relative movement between the secondary tool and the workpiece is achieved jointly by a movement of the movable stage (S2) along the one of the secondary guide rails (X2) as well as a movement of the secondary tool along the rest of the secondary guide rails (Y2, Z2).

14. The working station system according to claim 11, wherein the one of the secondary guide rails (X2) disposed at the level under the fixed stage (S1), and/or a moving range of the movable stage (S2) thereon, is partially located in the working station (D) without interfering with the components of the working station (D).

15. The working station system according to claim 11, wherein the movable stage (S2) is disposed at a level same as the fixed stage (S1).

16. The working station system according to claim 11, wherein during transferring the workpiece between the working station (D) and the plug-in station (I), the primary or secondary tool is replaced by a picking tool to transfer the workpiece.

17. The working station system according to claim 11, further comprising a mechanical arm for transferring the workpiece between the working station (D) and the plug-in station (I).

18. The working station system according to claim 1, wherein the at least one component included in each working station (D) further includes another fixed stage (S1b) for loading another workpiece, another three primary guide rails (X1b, Y1b, Z1b) oriented in different directions and disposed above the another fixed stage (S1b), wherein one of the another primary guide rails (X1b) is parallel to a transmission direction of the another workpiece, and another primary tool disposed to move along the another three primary guide rails (X1b, Y1b, Z1b) for processing the another workpiece, wherein the transmission direction of the workpiece is parallel to the transmission direction of the another workpiece.

19. The working station system according to claim 18, wherein the at least one component included in each plug-in station (I) includes a movable stage (S2) for loading and transmitting the workpiece and the another workpiece, three secondary guide rails (X2, Y2, Z2) oriented in different directions, wherein two of the secondary guide rails (X2, Y2) are disposed at a level under the fixed stage (S1a) and the another fixed stage (S1b) in which one of the two of the secondary guide rails (X2) is parallel to the transmission direction of the workpiece and the transmission direction of the another workpiece, and the movable stage (S2) is disposed thereon, and a rest of the secondary guide rails (Z2) is disposed above the movable stage (S2), and a secondary tool disposed to move along the rest of the secondary guide rails (Z2) for processing the workpiece and the another workpiece.

20. The working station system according to claim 18, wherein the plug-in station (I) receives (i) the workpiece from the fixed stage (S1a) or (ii) the another workpiece from the another fixed stage (S1b) of a previous working station (D), and supplies the processed workpiece or the processed another workpiece to the fixed stage (S1a) or the another fixed stage (S1b) of a next working station (D) after processing of the plug-in station (I).

21. The working station system according to claim 18, wherein the at least one component included in each plug-in station (I) includes a movable stage (S2a) for loading and transmitting the workpiece, three secondary guide rails (X2a, Y2, Z2) oriented in different directions, wherein one of the secondary guide rails (X2a) parallel to the transmission direction of the workpiece is disposed at a level under the fixed stage (S1a) and the movable stage (S2a) is disposed thereon, another movable stage (S2b) for loading and transmitting the another workpiece, another secondary guide rail (X2b) parallel to the transmission direction of the another workpiece and disposed at a level under the another fixed stage (S1b) and the another movable stage (S2b) is disposed thereon, and a secondary tool, wherein the rest of the secondary guide rails (Y2, Z2) are disposed above the movable stage (S2a) and the another movable stage (S2b), and wherein the secondary tool is disposed to move along the rest of the secondary guide rails (Y2, Z2) for processing the workpiece and the another workpiece.

22. The working station system according to claim 21, wherein the movable stage (S2a) of the plug-in station (I) receives the workpiece from the fixed stage (S1a) of a previous working station (D), and supplies the processed workpiece to the fixed stage (S1a) of a next working station (D) after processing of the plug-in station (I), and the another movable stage (S2b) of the plug-in station (I) receives the another workpiece from the another fixed stage (S1b) of a previous working station (D), and supplies the processed another workpiece to the another fixed stage (S1b) of a next working station (D) after processing of the plug-in station (I).

23. The working station system according to claim 18, wherein the at least one component included in each plug-in station (I) includes a movable stage (S2a) for loading and transmitting the workpiece, three secondary guide rails (X2a, Y2a, Z2a) oriented in different directions, wherein one of the secondary guide rails (X2a) parallel to the transmission direction of the workpiece is disposed at a level under the fixed stage (S1a) and the movable stage (S2a) is disposed thereon, and a rest of the secondary guide rails (Y2a, Z2a) are disposed above the movable stage (S2a), a secondary tool disposed to move along the rest of the secondary guide rails (Y2a, Z2a) for processing the workpiece, another movable stage (S2b) for loading and transmitting the another workpiece, another three secondary guide rails (X2b, Y2b, Z2b) oriented in different directions, wherein one of the another secondary guide rails (X2b) parallel to the transmission direction of the another workpiece is disposed at a level under the another fixed stage (S1b) and the another movable stage (S2b) is disposed thereon, and a rest of the another secondary guide rails (Y2b, Z2b) are disposed above the another movable stage (S2b), and another secondary tool disposed to move along the rest of the another secondary guide rails (Y2b, Z2b) for processing the another workpiece.

24. The working station system according to claim 1, wherein a plug-in station (I) is interposed between two adjacent working stations (D), and the component included in the plug-in station (I) and/or the moving range thereof is inserted into each of the two adjacent working stations (D) by 200 to 300 mm, respectively, so as to have a reduced interposed station width (W4) of 100 to 200 mm.

25. The working station system according to claim 1, wherein a plug-in station (I) is disposed at an end of the working station system, and the component included in the plug-in station (I) and/or the moving range thereof is inserted into an adjacent working station (D) by 200 to 300 mm, so as to have a reduced station width (W5) of 300 to 500 mm.

26. A working station system for electronics assembly, comprising:

a plurality of working stations (D) and at least one plug-in station (I), which are alternatively arranged and partially overlapped with each other, one of the at least one plug-in stations (I) is interposed between two adjacent working stations (D), wherein at least one of (i) at least one component included in the interposed plug-in station (I), and (ii) a moving range thereof, is partially located in each of the two working stations (D) without interfering with components included therein, thereby reducing a total width of the working station system, the component included in the interposed plug-in station (I) and/or the moving range thereof is inserted into each of the two adjacent working stations (D) by 200 to 300 mm, respectively, so as to have a reduced interposed station width (W4) of 100 to 200 mm.

27. A working station system for electronics assembly, comprising:

at least one working station (D) and at least one plug-in station (I), which are alternatively arranged and partially overlapped with each other, one of the at least one plug-in stations (I) is disposed at an end of the working station system, wherein at least one of (i) at least one component included in the plug-in station (I) disposed at the end of the working station system, and (ii) a moving range thereof, is partially located in an adjacent working station (D) without interfering with components included in the adjacent working station (D), thereby reducing a total width of the working station system, the component included in the plug-in station (I) disposed at the end of the working station system and/or the moving range thereof is inserted into the adjacent working station (D) by 200 to 300 mm, so as to have a reduced station width (W5) of 300 to 500 mm.

* * * * *